(12) United States Patent
Kawai

(10) Patent No.: US 6,456,174 B1
(45) Date of Patent: Sep. 24, 2002

(54) TUNING CIRCUIT

(75) Inventor: Kazuo Kawai, Tokyo (JP)

(73) Assignee: General Research of Electronics, Inc., Tokyo (JP)

( * ) Notice: Subject to any disclaimer, the term of this patent is extended or adjusted under 35 U.S.C. 154(b) by 0 days.

(21) Appl. No.: 09/908,142

(22) Filed: Jul. 18, 2001

(30) Foreign Application Priority Data

Sep. 22, 2000  (JP) ........................................ 2000-288288

(51) Int. Cl.[7] .............................................. H03H 11/44
(52) U.S. Cl. ........................................... 333/216; 334/1
(58) Field of Search ................................. 333/217, 216, 333/214, 213; 327/169, 268, 498

(56) References Cited

U.S. PATENT DOCUMENTS 4,156,823 A * 5/1979 Suzuki ........................ 310/317
4,338,582 A * 7/1982 Presser ........................ 333/175

FOREIGN PATENT DOCUMENTS

JP          408335828 A  * 12/1996

* cited by examiner

*Primary Examiner*—Michael Tokar
*Assistant Examiner*—James H Cho
(74) *Attorney, Agent, or Firm*—Flynn, Thiel, Boutell & Tanis, P.C.

(57) ABSTRACT

A tuning circuit enables its Q to be always maintained with the condition of high grade even when tuning frequency of the tuning circuit is changed. The tuning circuit is constituted in such a way that a negative resistance circuit is connected to the tuning circuit in series. Series resistance component of an inductor of the tuning circuit is divided into a fixed resistance component $r0$ having nothing to do with a frequency and a variable resistance component $r1$ which is changed depending on a frequency. Load resistances $r0'$, and $r1'$ of the negative resistance circuit are made to correspond to the fixed resistance component $r0$ and the variable resistance component $r1$ respectively. When changing the tuning frequency, operation is made to control in such a way that the load resistance $r1'$ of the negative resistance circuit which corresponds to the variable resistance component $r1$ is changed while corresponding to change of actual resistance value of the tuning circuit.

5 Claims, 2 Drawing Sheets

TUNING CIRCUIT

BACKGROUND OF THE INVENTION

1. Field of the Invention

The present invention relates to a tuning circuit, more particularly the present invention relates to circuit constitution techniques for increasing Q by adding a negative resistance circuit to the tuning circuit in a receiver for using medium frequency band, short wave band, ultra-short wave band or so forth.

2. Description of the Related Art

Improvement of cross modulation characteristic of a receiver can best be done by improving frequency selectivity in a high-frequency wave section. However, efforts are generally made to increase Q of the tuning circuit as large as possible on the occasion of designing. For that reason, in most cases, it is difficult to further improve. Accordingly, there is no measure for improving the Q of the tuning circuit other than increase in the number of stage of the tuning circuit while adding high-frequency amplifier. However, it becomes necessary to interlock a plurality of tuning circuits with one another when increasing high-frequency amplifiers. Practically, it is very difficult to interlock a plurality of the tuning circuits with tuning frequency of the tuning circuit accurately made consistent over wide frequency band.

Accordingly, it may be possible to consider that attempt is made to increase Q of the tuning circuit by use of negative resistance circuit. The negative resistance circuit formerly was used in the Regenerative Detection receiver. In this Regenerative Detection system used here, it is possible to increase Q and gain in such a way as to approximately cancel resistance component that the tuning circuit originally possesses by use of the negative resistance generated caused by the positive feedback.

However, there occurs a problem when adopting the above-described Regenerative Detection system for increasing Q of the tuning circuit. In the Regenerative Detection system, oscillating state takes place when effective resistance becomes negative while passing resistance value zero. Therefore, operation should be made to set immediately before oscillating state. Further, as to this setting, different value of Q is adopted depending on the frequency. Thereby, complicated manual resetting should be performed in every channel selection.

SUMMARY OF THE INVENTION

The present invention has been made in consideration of the above-mentioned problem, and an object of the present invention is to provide a tuning circuit capable of always maintaining Q in high grade level even when changing tuning frequency of the tuning circuit.

In order to achieve the above mentioned object, according to a first aspect of the present invention, there is provided a tuning circuit in which an inductor, a variable capacitor, and a negative resistance circuit are connected in series, which tuning circuit comprises control means for controlling the negative resistance circuit so as to compensate a series resistance component of the inductor depending on change of tuning frequency by manipulations of the variable capacitor.

According to a second aspect of the present invention, in the first aspect, there is provided a tuning circuit, wherein the series resistance component consists of a fixed resistance component having nothing to do with a frequency and a variable resistance component whose resistance value is changed depending on a frequency, and a load resistance of the negative resistance circuit is constituted by a first and a second resistance components corresponding to the fixed resistance component and variable resistance component respectively, in which the control means controls the second resistance component so that the second resistance component changes depending on changes of the variable resistance component.

According to a third aspect of the present invention, in the first or the second aspect, there is provided a tuning circuit, wherein the negative resistance circuit is symmetry type multi-vibrator circuit, and the control means is a gain-polarity control section, in which a frequency control voltage which is applied to the variable capacitor is input to the gain-polarity control section.

According to a fourth aspect of the present invention, in the third aspect, there is provided a tuning circuit, wherein the gain-polarity control section comprises a first operational amplifier, an inverting amplifier, a second operational amplifier, a switch connected to both the first operational amplifier and the inverting amplifier, and a potentiometer connected to both the switch and the second operational amplifier.

BRIEF DESCRIPTION OF THE DRAWINGS

The various features of novelty which characterize the invention are pointed out with particularly in the claims annexed to and forming a part of this specification. For a better understanding of the invention, its operating advantages, and specific objects attained by its use, reference should be had to the accompanying drawing and descriptive matter in which there is illustrated and described a preferred embodiment of the invention.

DETAILED DESCRIPTION OF THE PREFERRED EMBODIMENT

Figure 1:
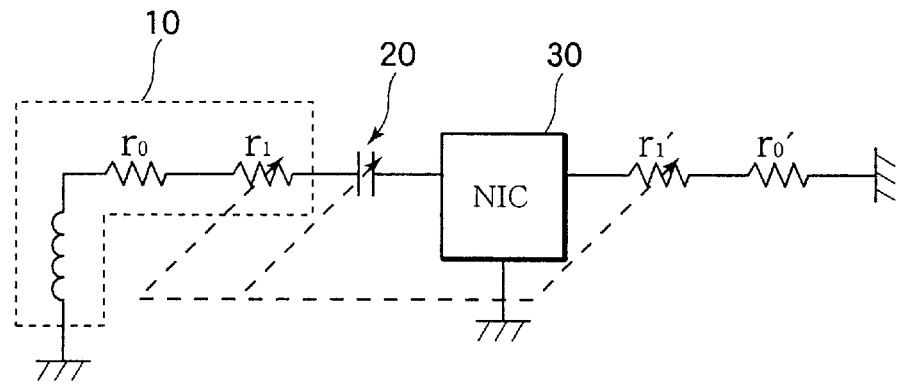
FIG. 1 is a circuit constitution view for explaining basic operation of a tuning circuit according to an embodiment of the present invention.

A preferred embodiment of the present invention will be described in detail referring to accompanying drawings below.

Firstly, before concrete explanation, the fundamental principle of the tuning circuit according to the present invention will be described.

The tuning circuit according to the embodiment of the present invention comprises an inductor, a tuning frequency adjusting variable capacitor, and a series resistance component. (here, the resistance component may be capable of being treated as parallel resistance, however, the resistance component can be regarded as the series resistance component depending on a reason described later.) The series resistance component is generally composed of a fixed resistance component and a high-frequency resistance component. The fixed resistance component has nothing to do with a frequency. The high-frequency resistance component changes depending on a frequency. Moreover, the high-frequency resistance component changes depending on the inductor. If the inductor comprises cores, since value of copper loss and/or value of core loss become different value depending on shape of cores, material of cores, shape of coil, or activity frequency band, state of variation of resistance value to the frequency is multifarious. Consequently, in order to compensate this series resistance component by use of the negative resistance circuit, value of the negative resistance of the negative resistance circuit is constituted in such a way that it becomes combined resistances of fixed resistance component and variable resistance component capable of varying corresponding to frequency, then control of resistance value of the variable resistance component should be made to cope with change of actual resistance value of the above high-frequency resistance value.

When compensating resistance component of the tuning circuit, compensation of the series resistance component is more advantageous than compensation of parallel resistance component. The reason is as follows: Namely, an inductance is L, a series resistance component is r, as is generally known, Q is ωL/r, simply, it is assumed that r is constant even when changing ω, since Q changes in proportion to ω, even though the frequency changes, 3 dB band width (ω/Q) does not change. This characteristic is important for the case of the receiver that changes reception frequency. However, in the case of compensation of the parallel resistance component, complicated control is required. When the tuning frequency is changed, the parallel resistance component changes in proportion to square value of the frequency. Accordingly, it becomes necessary to control the value of the compensating negative resistance in such a way as to change in proportion to square value of the frequency in order to maintain unchanged 3 dB band-width. Consequently, it is necessary to perform more complicated control and additional control in comparison with the former. This is the reason why compensation of the series resistance component is advantageous. For that reason, the tuning circuit of the present invention is constituted in such a way as to become loop shape while connecting an inductor, a tuning frequency adjusting variable capacitor and a negative resistance circuit in series.

The negative resistance circuit is one in which load of Negative Impedance Converter (Hereinafter referred to as only NIC) is set to resistance. Circuit of various forms is well known. Here, there will be explained of the case where circuit of symmetry type multi-vibrator form is used. The circuit of symmetry type multi-vibrator form is also used in the high-frequency band. Adjustment of the circuit itself is easy.

FIG. 1 is a circuit constitution view for explaining fundamental operation in the tuning circuit according to the embodiment of the present invention. In FIG. 1, four fundamental constitution elements of the tuning circuit are illustrated. The fundamental constitution elements are an inductor 10, a tuning frequency adjusting variable capacitor 20, a fixed resistance component r0 which has nothing to do with the frequency among series resistance component of the inductor 10, and a variable resistance component r1 which changes depending on change of frequency among the series resistance component of the inductor 10. Further, in the negative resistance circuit 30, r0', r1' indicate negative resistance thereof and correspond to aforementioned r0, r1.

As for the NIC 30, an input impedance is converted into one obtained in such a way as to turn over polarity of load impedance thereof (actually, coefficient determined depending on circuit constitution is multiplied, however, simply, here, coefficient=1). Therefore, effective resistance of the tuning circuit decrease to r0 r0'+r1 r1'. This effective resistance should be made to minimize as small as possible. In order to minimize the effective resistance, r0 is made to set to a value close to r0' as near as possible. At the same time, r1' is made to change in such a way as to follow change of r1 with the value close to r1 as near as possible.

Figure 2:
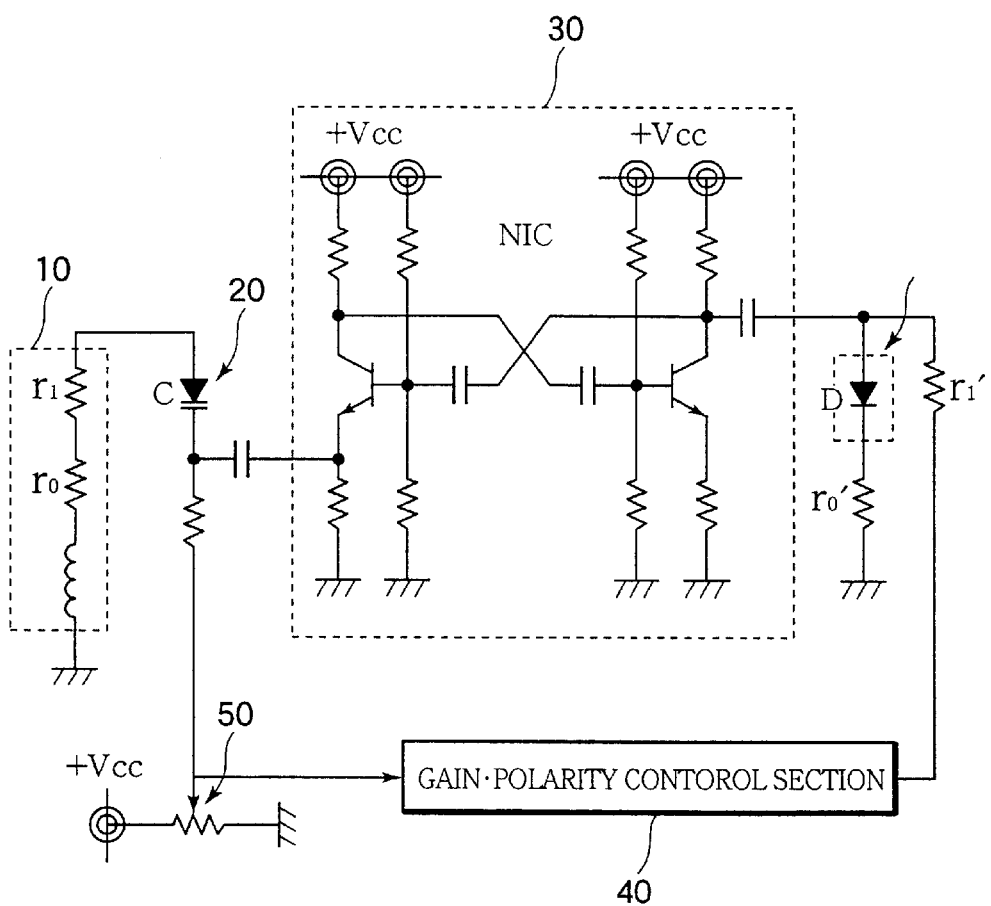
FIG. 2 is a circuit constitution view for explaining concrete embodiment.

FIG. 2 is a view illustrating concrete embodiment of the tuning circuit illustrated in FIG. 1. As illustrated in FIG. 2, a variable capacitance diode is used for the tuning frequency adjusting variable capacitor 20, a circuit of a multi-vibrator form is used for the NIC 30 as described-above, and an internal resistance of a diode D is used for a variable resistance of the load resistance r1'. Reference numeral 50 indicates capacitance of the variable capacitance diode 20, consequently, it is a potentiometer for adjusting tuning frequency. As described-above, the variable resistance component r1 of the inductor 10 changes variously depending on the frequency. Values of the variable resistance component r1 increases in approximately proportion to the frequency. On the contrary, values of the variable resistance component r1 decrease. Amounts of fluctuation are of various sizes. Consequently, the load resistance r1' should be made to change in order to cancel fluctuation of the variable resistance component r1. Accordingly, as illustrated in FIG. 2, DC voltage of output of the tuning frequency controlling potentiometer 50 is added to the gain-polarity control section 40. Largeness and direction of the load resistance r1' is made to set in such a way as to match the objective series resistance value r1 depending on current-internal resistance characteristic of the diode 20 now in use.

Figure 3:
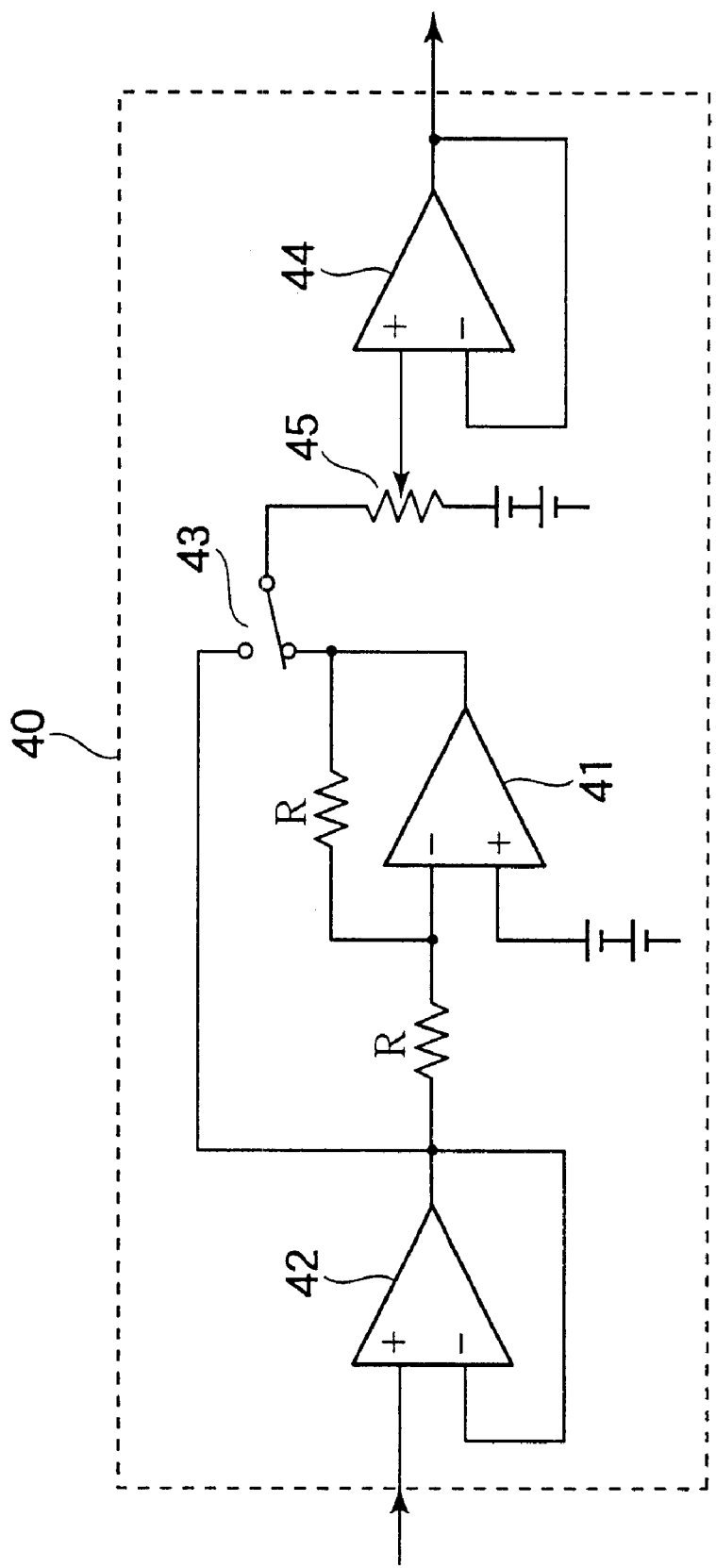
FIG. 3 is a circuit constitution view for explaining internal constitution example of a gain-polarity control section of FIG. 2.

FIG. 3 is a view illustrating circuit constitution of the gain-polarity control section 40 for performing setting of this gain-polarity control. The gain-polarity control section 40 comprises an inverting amplifier 41, first and second operational amplifiers 42 and 44, a switch 43, and a potentiometer 45. As is clear from FIG. 3, it is possible to determine gain and polarity of the output voltage depending on whether the signal is taken out from input side of the inverting amplifier 41 (gain=1) or the signal is taken out from output side of the inverting amplifier 41 (gain=1) by use of the switch 43. And gain and polarity of the output voltage are determined depending on which position to set the potentiometer 45. Further, in FIG. 3, R indicates the same resistance.

Furthermore, in the above explanation, the resistance component capable of being compensated by setting of this gain-polarity control section 40 is only a primary component to the frequency. It is sufficient for the general receiver. However, when also the secondary component is necessary, it is suitable that circuit with the secondary characteristic is added to the gain-polarity control section 40.

As described-above, according to the tuning circuit of the present invention, in the tuning circuit of the receiver for use in the medium wave band, the short wave band, or the ultra short wave band, the inductor, the capacitor and the negative resistance circuit are connected in series to form a loop. In order to cancel the greater part of the series resistance component of the inductor by the negative resistance circuit, the series resistance component of the inductor is divided into fixed resistance component having nothing to do with the frequency and variable resistance component which is variable depending on the frequency, then the load resistance of the negative resistance circuit is made to correspond to both the fixed resistance component and the variable resistance component, when changing the frequency, the negative resistance of the negative resistance circuit corresponding to the variable resistance component is constituted so that the load resistance of the negative resistance circuit changes in relation to change of actual resistance value of the tuning circuit, therefore, Q is capable of being always set to high grade value even though frequency of the tuning circuit is changed. For that reason, the high-frequency amplifier is not necessary. The cross modulation is difficult to occur. As a result, also, the selectivity is capable of being improved.

While there has been described what is at present considered to be preferred embodiment of the invention, it will be understood that various modifications may be made therein, and it is intended to cover in the appended claims all such modifications as fall within the true spirit and scope of the invention.

What is claimed is:

1. A tuning circuit including an inductor, a variable capacitor, and a negative resistance circuit connected in series, comprising a controller for controlling said negative resistance circuit so as to compensate a series resistance component of said inductor depending on change of tuning frequency by manipulations of said variable capacitor, wherein said series resistance component comprises a fixed resistance component having no change in resistance in response to frequency and a variable resistance component whose resistance value is changed depending on frequency, and a load resistance of said negative resistance circuit is defined by first and second resistance components corresponding to said fixed resistance component and said variable resistance component respectively, in which said controller controls said second resistance component so that said second resistance component changes depending on changes of said variable resistance component.

2. The tuning circuit according to claim 1, wherein said variable capacitor comprises a variable capacitance diode.

3. A tuning circuit including an inductor, a variable capacitor, and a negative resistance circuit connected in series, comprising a controller for controlling said negative resistance circuit so as to compensate a series resistance component of said inductor depending on change of tuning frequency by manipulations of said variable capacitor, wherein said negative resistance circuit comprises a symmetry type multi-vibrator circuit, and said controller comprises a gain-polarity control section, in which a frequency control voltage which is applied to said variable capacitor is input to said gain-polarity control section.

4. The tuning circuit according to claim 3, wherein said gain-polarity control section comprises a first operational amplifier, an inverting amplifier, a second operational amplifier, a switch connected to both said first operational amplifier and said the inverting amplifier, and a potentiometer connected to both said switch and said second operational amplifier.

5. The tuning circuit according to claim 3, wherein said variable capacitor comprises a variable capacitance diode.

* * * * *